(12) United States Patent
Chiu et al.

(10) Patent No.: US 12,111,353 B2
(45) Date of Patent: Oct. 8, 2024

(54) TESTING SYSTEM AND TESTING METHOD

(71) Applicant: Realtek Semiconductor Corporation, Hsinchu (TW)

(72) Inventors: Shih-Hsuan Chiu, Hsinchu (TW); Meng-Che Li, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 176 days.

(21) Appl. No.: 18/048,437

(22) Filed: Oct. 20, 2022

(65) Prior Publication Data
US 2023/0324459 A1  Oct. 12, 2023

(30) Foreign Application Priority Data

Apr. 8, 2022  (TW) .................................. 111113482

(51) Int. Cl.
*G01R 31/317* (2006.01)
*H04L 7/00* (2006.01)
*H04L 7/033* (2006.01)

(52) U.S. Cl.
CPC . *G01R 31/31727* (2013.01); *G01R 31/31726* (2013.01); *H04L 7/0054* (2013.01); *H04L 7/0331* (2013.01)

(58) Field of Classification Search
CPC ........ G01R 31/31727; G01R 31/31726; G01R 31/31922; H04L 7/0054; H04L 7/0331; H04L 7/046

USPC ......................................................... 375/376
See application file for complete search history.

(56) References Cited

U.S. PATENT DOCUMENTS

| 2005/0246603 | A1  | 11/2005 | Rottacker et al. |
| 2009/0310728 | A1* | 12/2009 | Jaussi .............. G01R 31/31708 |
| | | | 375/371 |
| 2011/0199134 | A1  | 8/2011  | Watanabe |
| 2014/0269872 | A1* | 9/2014  | Onodera ................. H04L 1/205 |
| | | | 375/226 |

FOREIGN PATENT DOCUMENTS

CN  103140768 A  6/2013

* cited by examiner

*Primary Examiner* — Fitwi Y Hailegiorgis
(74) *Attorney, Agent, or Firm* — CKC & Partners Co., LLC

(57) ABSTRACT

A testing system includes a signal generator circuit, a jitter modulation circuit, and an oscilloscope circuit. The signal generator circuit is configured to generate a clock pattern signal with a single clock pattern frequency. The jitter modulation circuit is configured to generate a jitter signal. A device-under-test is configured to receive an input signal. The input signal is a combination signal of the clock pattern signal and the jitter signal. The device-under-test includes a clock data recovery circuit and is further configured to generate an output signal according to the input signal. The oscilloscope circuit is configured to receive the output signal for determining performance of the clock data recovery circuit.

20 Claims, 5 Drawing Sheets

TESTING SYSTEM AND TESTING METHOD

RELATED APPLICATIONS

This application claims priority to Taiwanese Application Serial Number 111113482, filed Apr. 8, 2022, which is herein incorporated by reference.

BACKGROUND

Technical Field

The present disclosure relates to testing technology. More particularly, the present disclosure relates to a testing system and a testing method.

Description of Related Art

With development of technology, operation speed and data rate of integrated circuits have been greatly increased. The probability of errors between data transmitted from a transmitter and data received by a receiver increases. The clock data recovery (CDR) circuit is usually used to ensure that the receiver can receive data correctly.

SUMMARY

Some aspects of the present disclosure are to provide a testing system. The testing system includes a signal generator circuit, a jitter modulation circuit, and an oscilloscope circuit. The signal generator circuit is configured to generate a clock pattern signal with a single clock pattern frequency. The jitter modulation circuit is configured to generate a jitter signal. A device-under-test is configured to receive an input signal. The input signal is a combination signal of the clock pattern signal and the jitter signal. The device-under-test includes a clock data recovery circuit and is further configured to generate an output signal according to the input signal. The oscilloscope circuit is configured to receive the output signal for determining performance of the clock data recovery circuit.

Some aspects of the present disclosure are to provide a testing method. The testing method includes following operations: generating, by a signal generator circuit, a clock pattern signal with a single clock pattern frequency; generating, by a jitter modulation circuit, a jitter signal; receiving, by a device-under-test, an input signal, in which the input signal is a combination signal of the clock pattern signal and the jitter signal, in which the device-under-test includes a clock data recovery circuit; generating, by the device-under-test, an output signal according to the input signal; and receiving, by an oscilloscope circuit, the output signal for determining performance of the clock data recovery circuit.

As described above, in the present disclosure, the signal generator circuit can generate the clock pattern signal with the single clock pattern frequency, and the clock pattern signal can be utilized to test the device-under-test. Thus, the present disclosure can exclude the influence of other circuits (e.g., the receiver front-end circuit) on the performance of the device-under-test, and the performance of the clock data recovery circuit in the device-under-test can be directly determined.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
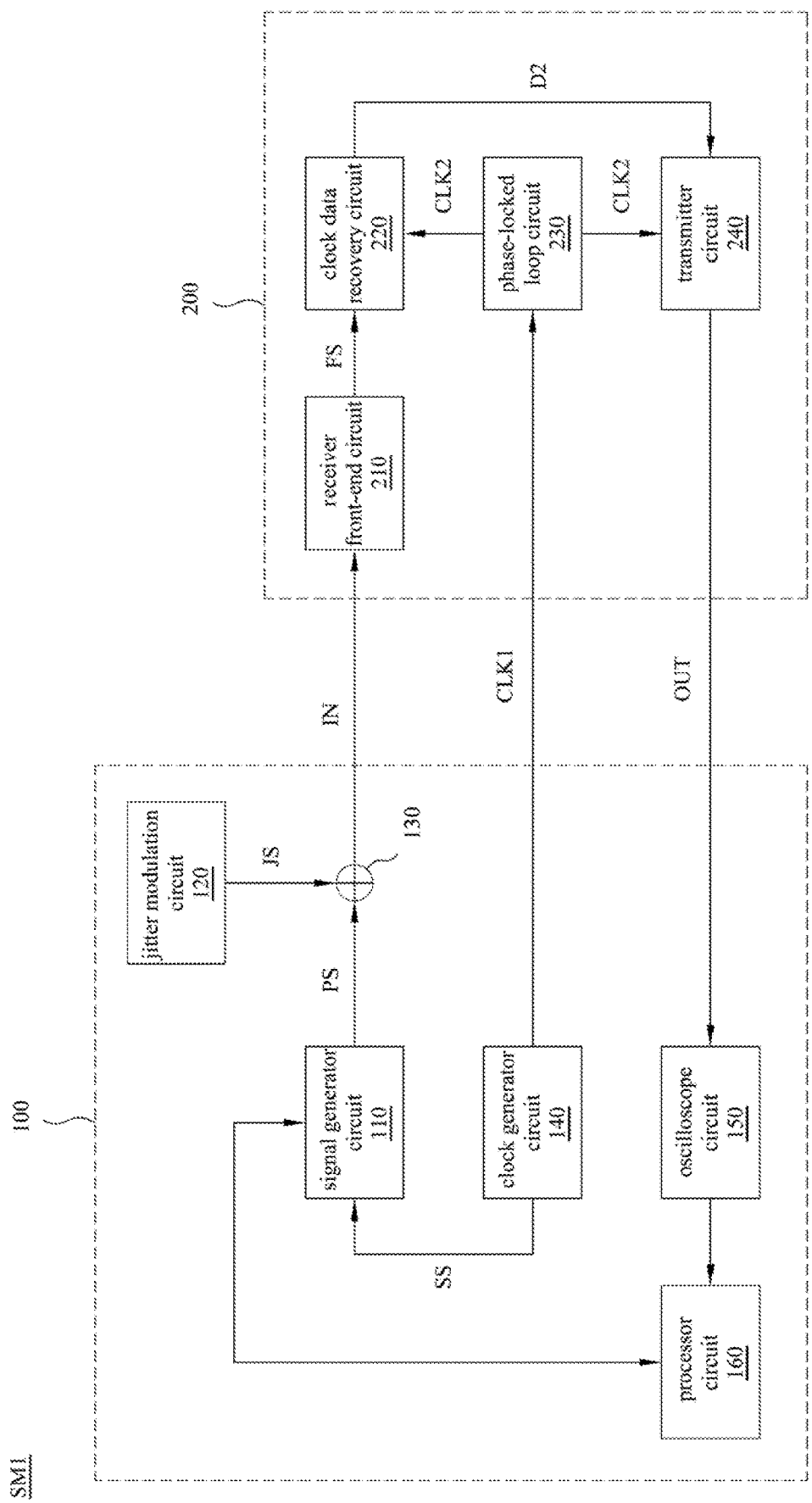
FIG. 1 is a schematic diagram of a testing system according to some embodiments of the present disclosure.

Reference is made to FIG. 1. FIG. 1 is a schematic diagram of a testing system SM1 according to some embodiments of the present disclosure. As illustrated in FIG. 1, the testing system SM1 includes a testing apparatus 100 and a device-under-test (DUT) 200. The testing apparatus 100 is configured to test the device-under-test 200.

As illustrated in FIG. 1, the testing apparatus 100 includes a signal generator circuit 110, a jitter modulation circuit 120, an adder 130, a clock generator circuit 140, an oscilloscope circuit 150, and a processor circuit 160.

In some embodiments, the signal generator circuit 110, the jitter modulation circuit 120, and the clock generator circuit 140 can be implemented by Application Specific Integrated Circuits (ASICs). In some embodiments, the oscilloscope circuit 150 can be an oscilloscope or other similar circuits. In some embodiments, the processor circuit 160 can be a central processor or other similar circuits.

In some embodiments, the signal generator circuit 110, the jitter modulation circuit 120, the adder 130, and the clock generator circuit 140 can be disposed in one apparatus. However, the present disclosure is not limited thereto. In some other embodiments, the signal generator circuit 110, the jitter modulation circuit 120, the adder 130, and the clock generator circuit 140 are not disposed in one apparatus.

In some embodiments, the device-under-test 200 can be a receiver and it is configured to receive signals from a transmitter.

As illustrated in FIG. 1, the device-under-test 200 includes a receiver front-end circuit 210, a clock data recovery (CDR) circuit 220, a phase-locked loop circuit 230, and a transmitter circuit 240.

In some embodiments, the receiver front-end circuit 210, the clock data recovery circuit 220, the phase-locked loop circuit 230, and the transmitter circuit 240 can be implemented by ASICs.

Regarding the coupling relationship, the signal generator circuit 110 and the jitter modulation circuit 120 are coupled to the adder 130 (to combine signals). The clock generator circuit 140 is coupled to the signal generator circuit 110. The oscilloscope circuit 150 is coupled to the processor circuit 160 (to compare signals). The receiver front-end circuit 210 is coupled to the clock data recovery circuit 220. The clock data recovery circuit 220 is coupled to the phase-locked loop circuit 230 and the transmitter circuit 240. The phase-locked loop circuit 230 is coupled to the transmitter circuit 240. When the testing apparatus 100 tests the device-under-test 200, the adder 130 can be coupled to the receiver front-end circuit 210, the clock generator circuit 140 can be coupled to the phase-locked loop circuit 230, and the oscilloscope circuit 150 can be coupled to the transmitter circuit 240.

Regarding the operations, the signal generator circuit 110 can generate a clock pattern signal PS. The clock pattern signal PS is a signal with a single clock pattern frequency (e.g., only one frequency). In other words, the clock pattern signal PS has a fixed clock pattern period. In some embodiments, the duty cycle of the clock pattern signal PS can be 50%. For example, the clock pattern signal PS can correspond to 001100110011. In this example, the clock pattern period of the clock pattern signal PS is 4 bits.

The jitter modulation circuit 120 can generate a jitter signal JS. The jitter signal JS can represent interference and is used to test interference tolerance of the device-under-test 200 (e.g., interference tolerance of the clock data recovery circuit 220 in the device-under-test 200). In some embodiments, a control circuit (not shown) can be used to control the jitter modulation circuit 120 to change the jitter frequency and the jitter intensity of the jitter signal JS.

One input terminal of the adder 130 can receive the clock pattern signal PS from the signal generator circuit 110, and the other input terminal of the adder 130 can receive the jitter signal JS from the jitter modulation circuit 120. Then, the adder 130 can combine the clock pattern signal PS and the jitter signal JS to generate an input signal IN.

The receiver front-end circuit 210 can receive the input signal IN, generates a front-end processing signal FS according to the input signal IN, and transmit the front-end processing signal FS to the clock data recovery circuit 220. In some embodiments, the receiver front-end circuit 210 can be a continuous time linear equalizer, but the present disclosure is not limited thereto. The linear equalizer is mainly configured to compensate signal components with different signal intensities, such that the signal intensities in the equalized signal can be closer.

The clock generator circuit 140 can generate a reference clock signal CLK1 to the phase-locked loop circuit 230. Then, the phase-locked loop circuit 230 can generate a clock signal CLK2 according to the reference clock signal CLK1. In some embodiments, a clock frequency of the clock signal CLK2 is greater than a clock frequency of the reference clock signal CLK1. For example, the clock frequency of the clock signal CLK2 is twice the clock frequency of the reference clock signal CLK1. The phase-locked loop circuit 230 can transmit the clock signal CLK2 to the clock data recovery circuit 220 and the transmitter circuit 240, such that the clock data recovery circuit 220 and the transmitter circuit 240 operate according to the clock signal CLK2.

The clock generator circuit 140 can perform a clock synchronization process on the signal generator circuit 110. As illustrated in FIG. 1, the clock generator circuit 140 can transmit a clock synchronization control signal SS to the signal generator circuit 110, such that operating clocks of the signal generator circuit 110 and the clock generator circuit 140 are synchronized.

The clock data recovery circuit 220 is mainly used to ensure that the receiver can receive data correctly. To be more specific, the clock data recovery circuit 220 can receive the front-end processing signal FS from the receiver front-end circuit 210, and generate recovery data D2 to the transmitter circuit 240 according to the front-end processing signal FS. Then, the transmitter circuit 240 can generate an output signal OUT according to the recovery data D2.

The output signal OUT can be configured for determining the performance of the clock data recovery circuit 220. As illustrated in FIG. 1, the oscilloscope circuit 150 can receive the output signal OUT from the transmitter circuit 240. The processor circuit 160 can calculate a frequency of the output signal OUT (called as calculation frequency hereafter) according to the signal received by the oscilloscope circuit 150. Then, the processor circuit 160 can compare the calculation frequency with the clock pattern frequency of the clock pattern signal PS to determine the performance of the clock data recovery circuit 220. In some embodiments, the processor circuit 160 can send a control command to control the signal generator circuit 110 to generate the clock pattern signal PS with the single specific clock pattern frequency. In this example, the processor circuit 160 acquires the clock pattern frequency of the clock pattern signal PS in advance, so the processor circuit 160 can compare the clock pattern frequency of the clock pattern signal PS with the calculation frequency. In some other embodiments, the clock pattern signal PS is sent to the processor circuit 160, and the processor circuit 160 can acquire the clock pattern frequency of the clock pattern signal PS according to the received clock pattern signal PS. Then, the processor circuit 160 can compare the clock pattern frequency of the clock pattern signal PS with the calculation frequency. The performance of the clock data recovery circuit 220 can be jitter tolerance of the clock data recovery circuit 220. For example, when the difference between the calculation frequency and the clock pattern frequency of the clock pattern signal PS is less, it represents that the clock data recovery circuit 220 has a greater tolerance to the jitter signal JS. When the clock data recovery circuit 220 has a greater tolerance, it represents that the performance of the clock data recovery circuit 220 is better. On the contrary, when the difference between the calculation frequency and the clock pattern frequency of the clock pattern signal PS is greater, it represents that the clock data recovery circuit 220 has a smaller tolerance to the jitter signal JS. When the clock data recovery circuit 220 has a smaller tolerance, it represents that the performance of the clock data recovery circuit 220 is worse.

In some embodiments, the processor circuit 160 is a processor. The processor circuit 160 and other circuits in the testing apparatus 100 are disposed in the same apparatus. In some embodiments, the processor circuit 160 is a computer. The processor circuit 160 and other circuits in the testing apparatus 100 are disposed in different apparatuses.

In some related approaches, a pseudorandom binary sequence (PRBS) or other sequence defined by other protocol is used to test the device-under-test to determine the performance of the clock data recovery circuit. However, the pseudorandom binary sequence or other sequence (e.g., random sequence) defined by other protocol has multiple different frequencies. There is a problem of data-dependent jitter (DDJ) for signals with different frequencies due to the circuit board, the package, or other factors. In other words, the attenuation of the signal components with different frequencies in the channel is different, and this makes the final signal intensities of the signal components with different frequencies to be different. When the data rate is higher, the problem of data-dependent clock jitter becomes more serious. This can cause inter-symbol interference (ISI). In order to avoid the aforementioned problem of data-dependent clock jitter, a receiver front-end circuit (e.g., a linear equalizer circuit) can be used to compensate the signal intensities of the signal components with different signal intensities. However, with this configuration, when the system determines that the overall performance of the device-under-test is poor, it is hard to directly diagnose whether it is the receiver front-end circuit (e.g., a linear equalizer circuit) or the clock data recovery circuit that contributes the poor performance.

Compared to the aforementioned related approaches, in the present disclosure, the clock pattern signal PS with the single clock pattern frequency can be utilized to test the device-under-test 200. Since the clock pattern signal PS has the single clock pattern frequency, there is no problem of data-dependent clock jitter. In other words, the receiver front-end circuit 210 does not require to compensate for signal intensities of the signal components with different frequencies. Thus, when it is determined that the overall performance of the device-under-test 200 is poor, it can be known that it is the clock data recovery circuit 220 that contributes poor performance (the performance of the clock data recovery circuit 220 is poor).

In addition, as described above, some related approaches use the pseudorandom binary sequence or other sequence (with multiple different frequencies) defined by other protocol to test the device-under-test. In these related approaches, an error detector can be used to check the output signal. For example, the error detector can analyze the pseudorandom binary sequence (or other sequence) with the output signal (e.g., check whether each bit of the pseudorandom binary sequence is consistent to each corresponding bit of the output signal). However, the error detector is expensive.

Compared to the aforementioned related approaches, in the present disclosure, since the clock pattern signal PS has the single clock pattern frequency, the present disclosure can directly uses the oscilloscope circuit 150 to compare the calculation frequency of the output signal OUT with the clock pattern frequency of the clock pattern signal PS. Since the oscilloscope circuit 150 (e.g., oscilloscope) has a relatively low price, the present disclosure has the advantage of lower cost.

Figure 2:
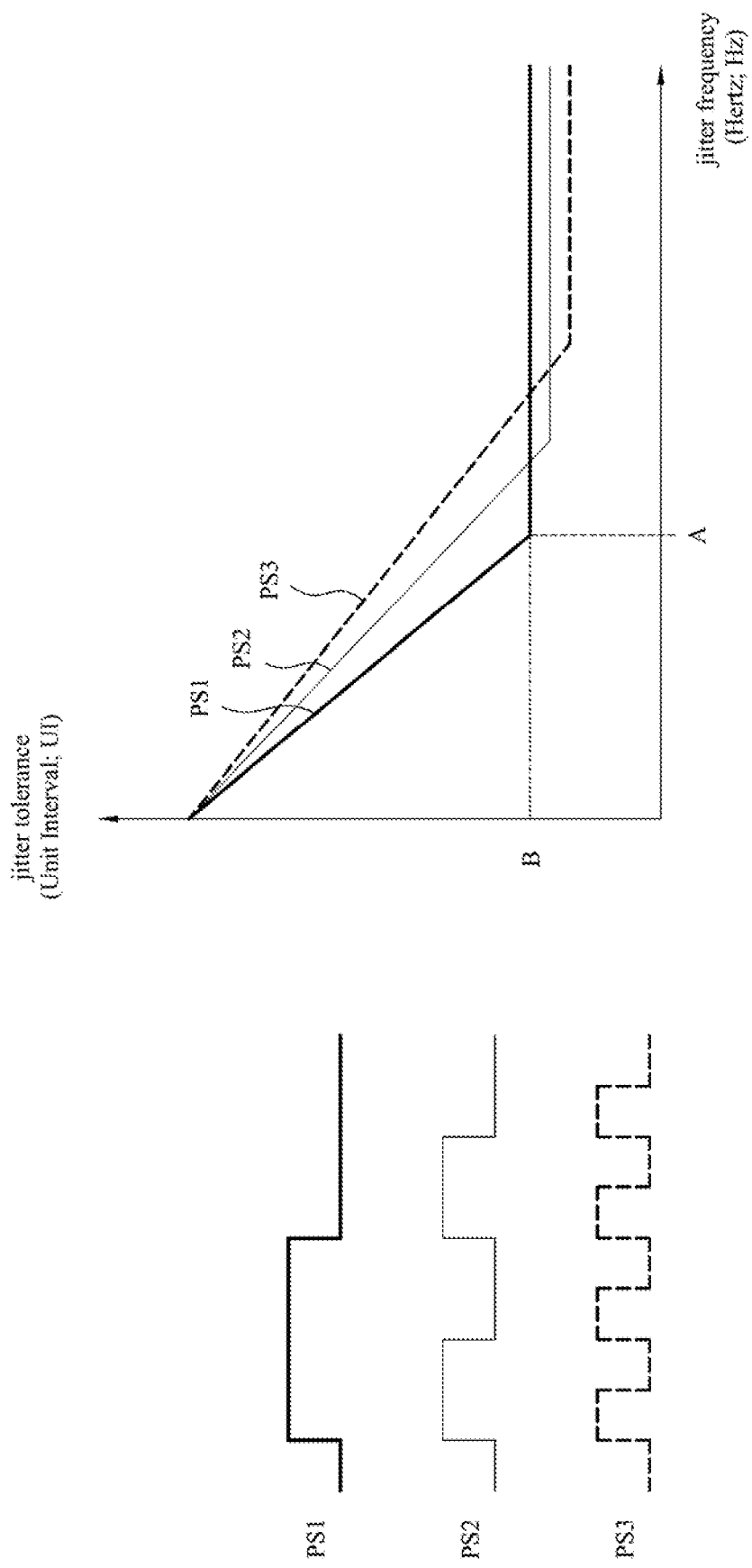
FIG. 2 is a schematic diagram of a relationship between jitter frequency and jitter tolerance according to some embodiments of the present disclosure.

Reference is made to FIG. 2. FIG. 2 is a schematic diagram of a relationship between the jitter frequency and the jitter tolerance according to some embodiments of the present disclosure. The unit of the jitter frequency of the jitter signal JS is Hertz (Hz), and the unit of the jitter tolerance can be Unit Interval (UI).

In some applications, the signal generator circuit 110 in FIG. 1 can generate multiple different clock pattern signals PS. As illustrated in FIG. 2, the signal generator circuit 110 can generate the clock pattern signal PS1, the clock pattern signal PS2, and the clock pattern signal PS3. The clock pattern signal PS1, the clock pattern signal PS2, and the clock pattern signal PS3 correspond to different clock pattern frequencies (different clock pattern periods) respectively. In this case, the clock pattern signal PS3 has a greatest clock pattern frequency, and the clock pattern signal PS1 has a smallest clock pattern frequency.

Taking the clock pattern signal PS1 in FIG. 2 as an example, when the jitter frequency of the jitter signal JS is A, the jitter tolerance of the clock data recovery circuit 220 is B. The "jitter tolerance of the clock data recovery circuit 220" described herein can correspond to the bandwidth of the clock data recovery circuit 220. In other words, when the jitter tolerance of the clock data recovery circuit 220 is greater, the data of the clock data recovery circuit 220 is less likely to be wrong due to interference.

As shown in FIG. 2, in the low frequency range (the slopes of the lines of these clock pattern signals are negative), for the same jitter frequency, the jitter tolerance of the clock pattern signal PS3 is greater and the jitter tolerance of the clock pattern signal PS1 is smaller. On the contrary, in the high frequency range (the slopes of the lines of these clock pattern signals are 0), for the same jitter frequency, the jitter tolerance of the clock pattern signal PS3 is smaller and the jitter tolerance of the clock pattern signal PS1 is greater.

Figure 3:
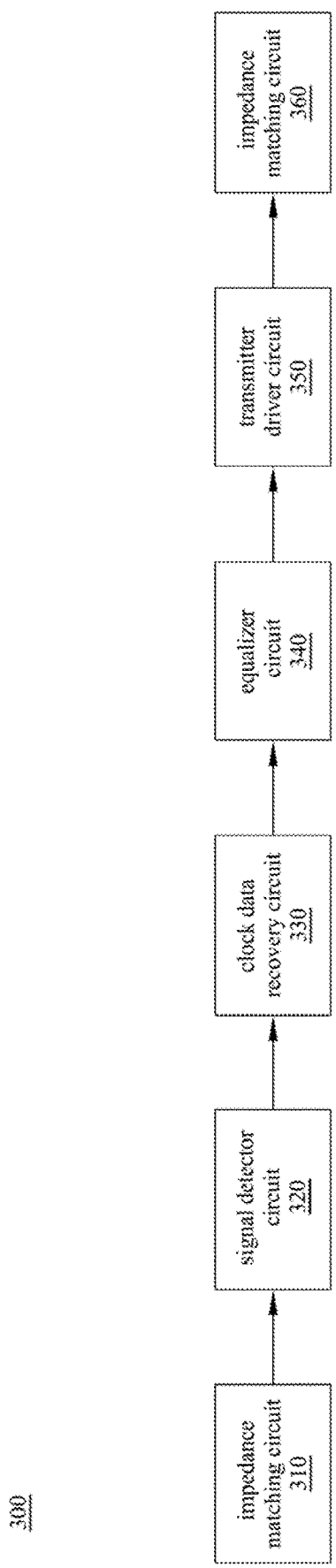
FIG. 3 is a schematic diagram of a device-under-test according to some embodiments of the present disclosure.

Reference is made to FIG. 3. FIG. 3 is a schematic diagram of a device-under-test 300 according to some embodiments of the present disclosure.

In some embodiments, the device-under-test 200 in FIG. 1 can be implemented by the device-under-test 300 in FIG. 3, and the device-under-test 300 is a re-timer.

As illustrated in FIG. 3, the device-under-test 300 includes an impedance matching circuit 310, a signal detector circuit 320, a clock data recovery circuit 330, an equalizer circuit 340 (its function is similar to that of the receiver front-end circuit 210 in FIG. 1), a transmitter driver circuit 350, and an impedance matching circuit 360.

In some embodiments, the impedance matching circuit 310 or the impedance matching circuit 360 can be implemented by one or more resistors. In some practical applications, the device-under-test 300 is disposed on a printed circuit board (PCB). The impedance matching circuit 310 connects other circuits on the printed circuit board through bonding wires to receive signals from these circuits. The impedance matching circuit 310 is used to perform impedance matching with these circuits on the printed circuit board such that the signals from these circuits can be inputted into the device-under-test 300 successfully (e.g., signal reflection is reduced). Similarly, the impedance matching circuit 360 connects other circuits on the printed circuit board through bonding wires to transmit signals to these circuits. The impedance matching circuit 360 is used to perform impedance matching with these circuits such that the signals can be transmitted to these circuits from the device-under-test 300 successfully (e.g., signal reflection is reduced).

When the device-under-test 300 is applied to the device-under-test 200 in FIG. 1, the testing apparatus 100 can use the clock pattern signal PS and the jitter signal JS to test the device-under-test 300 to exclude the problem of the aforementioned data-dependent clock jitter (to exclude the problem that it is unable to determine whether the performance of the clock data recovery circuit 330 is poor or the performance of the equalizer circuit 340 is poor). In addition, the oscilloscope circuit 150 and the processor circuit 160 can be used to analyze jitter components.

Figure 4:
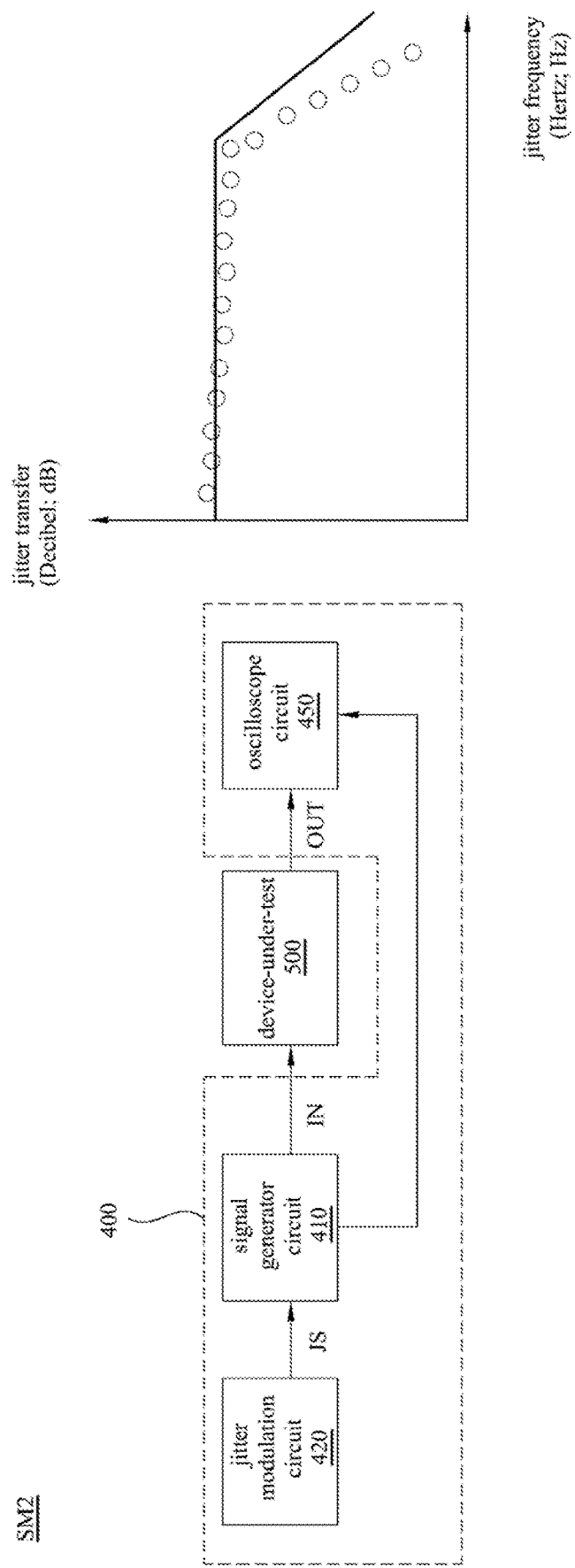
FIG. 4 is a schematic diagram of a testing system according to some embodiments of the present disclosure.

Reference is made to FIG. 4. FIG. 4 is a schematic diagram of a testing system SM2 according to some embodiments of the present disclosure. As illustrated in FIG. 4, the testing system SM2 includes a testing apparatus 400 and a device-under-test 500.

The testing apparatus 400 includes a signal generator circuit 410, a jitter modulation circuit 420, and an oscilloscope circuit 450. Similar to FIG. 1, the jitter modulation circuit 420 can generate a jitter signal JS. The signal generator circuit 410 can generate a clock pattern signal with a single clock pattern frequency, and the signal generator circuit 410 can generate an input signal IN to the device-under-test 500 according to this clock pattern signal and the jitter signal JS from the jitter modulation circuit 420.

In some embodiments, the device-under-test 500 can be a synchronous network. The synchronous network is, for example, a synchronous optical network (SONET) or a passive optical network (PON). In practical applications, the synchronous network includes a clock data recovery circuit and other circuits (e.g., an equalizer circuit).

Since the signal generator circuit 410 can generate the clock pattern signal with the single clock pattern frequency, there is no the data-dependence clock jitter problem. Thus, the oscilloscope circuit 450 and a processor (not shown) can directly determine the performance of the clock data recovery circuit in the device-under-test 500 according to the output signal OUT from the device-under-test 500.

In addition, the oscilloscope circuit 450 and the processor circuit can analyze the jitter transfer. For example, it can analyze the relationship of the jitter frequency of the jitter signal JS and the jitter transfer. The circles (practical measurement points) shown in FIG. 4 are practical measurement points, and the solid line in FIG. 4 is a curve from the specification sheet. The unit of the jitter frequency of the jitter signal JS is Hertz (Hz), and the unit of the jitter transfer can be Decibel (dB). The jitter transfer can correspond to the ratio between the jitter components in the output signal OUT and the jitter components in the input signal IN. The relationship diagram on the right of FIG. 4 can be used to determine the performance of the clock data recovery circuit in the device-under-test 500.

Figure 5:
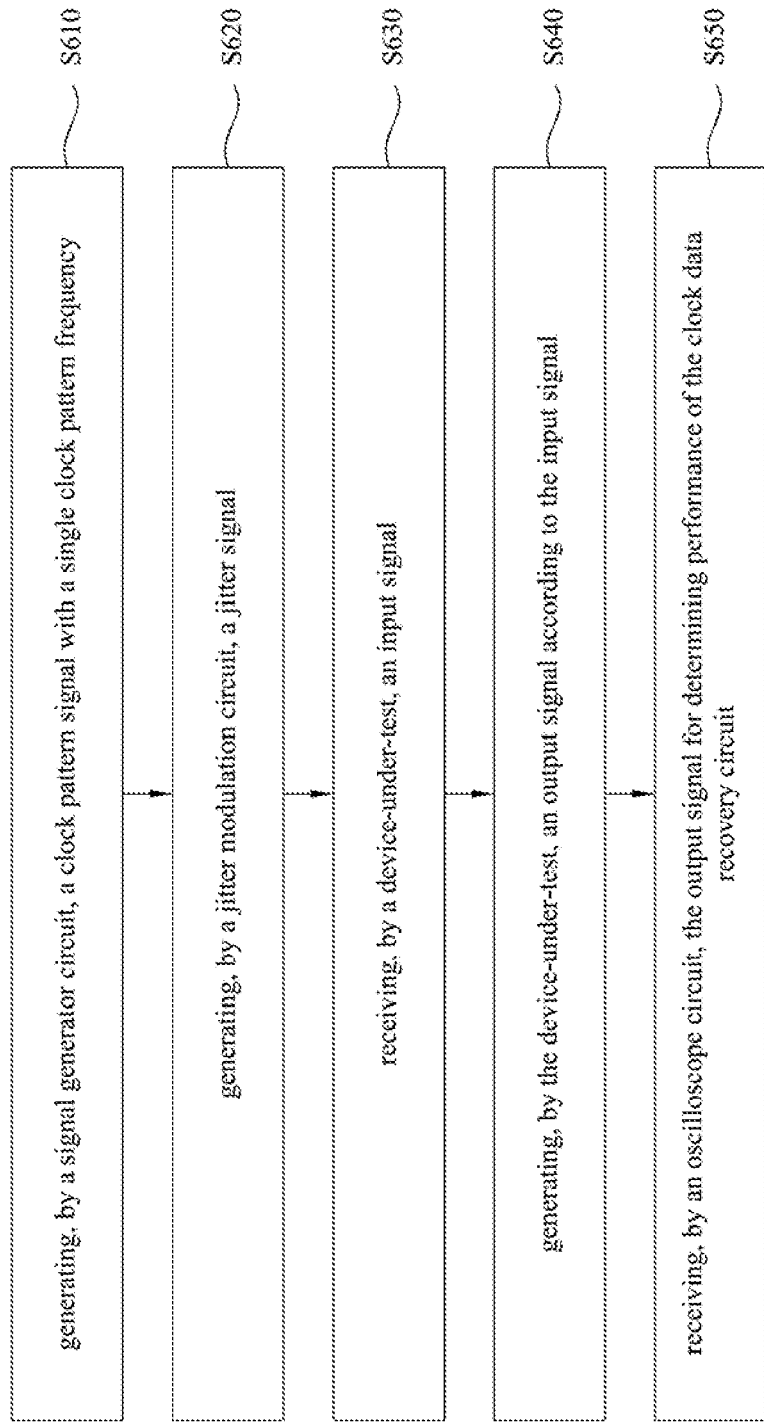
FIG. 5 is a flow diagram of a testing method according to some embodiments of the present disclosure.

Reference is made to FIG. 5. FIG. 5 is a flow diagram of a testing method 600 according to some embodiments of the present disclosure. As illustrated in FIG. 5, the testing method 600 includes operation S610, operation S620, operation S630, operation S640, and operation S650.

In some embodiments, the testing method 600 can be implemented to the testing system SM1 in FIG. 1, but the present disclosure is not limited thereto. For ease of understanding, the testing method 600 in FIG. 5 is described with the testing system SM1 in FIG. 1.

In operation S610, the signal generator circuit 110 generates the clock pattern signal PS with the single clock pattern frequency. In other words, the clock pattern signal PS has a fixed clock pattern period.

In operation S620, the jitter modulation circuit 120 generates the jitter signal JS. In some embodiments, different jitter signals JS can be generated by adjusting the jitter frequency and the jitter intensity of the jitter signal JS.

In operation S630, the device-under-test 200 receives the input signal IN. The input signal IN is the combination signal of the clock pattern signal PS and the jitter signal JS. In some embodiments, the adder 130 can combine the clock pattern signal PS and the jitter signal JS to generate the input signal IN.

In operation S640, the device-under-test 200 generates the output signal OUT according to the input signal IN. In some embodiments, the transmitter circuit 240 can generate the output signal OUT according to the recovery data D2.

In operation S650, the oscilloscope circuit 150 receives the output signal OUT for determining the performance of the clock data recovery circuit 220. In some embodiments, after the oscilloscope circuit 150 receives the output signal OUT, the processor circuit 160 can determine the jitter tolerance of the clock data recovery circuit 220 according to the signal received by the oscilloscope circuit 150 so as to determine the performance of the clock data recovery circuit 220.

As described above, in the present disclosure, the signal generator circuit can generate the clock pattern signal with the single clock pattern frequency, and the clock pattern signal can be utilized to test the device-under-test. Thus, the present disclosure can exclude the influence of other circuits (e.g., the receiver front-end circuit) on the performance of the device-under-test, and the performance of the clock data recovery circuit in the device-under-test can be determined directly.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A testing system, comprising:
    a signal generator circuit configured to generate a clock pattern signal with a single clock pattern frequency;
    a jitter modulation circuit configured to generate a jitter signal, wherein a device-under-test is configured to receive an input signal, wherein the input signal is a combination signal of the clock pattern signal and the jitter signal, wherein the device-under-test comprises a clock data recovery circuit and is further configured to generate an output signal according to the input signal; and
    an oscilloscope circuit configured to receive the output signal for determining performance of the clock data recovery circuit.

2. The testing system of claim 1, wherein the device-under-test further comprises:
    a receiver front-end circuit coupled to the signal generator circuit and the jitter modulation circuit, wherein the receiver front-end circuit is configured to generate a front-end processing signal according to the input signal, wherein the clock data recovery circuit is coupled to the receiver front-end circuit and is configured to generate recovery data according to the front-end processing signal; and
    a transmitter circuit coupled to the clock data recovery circuit, wherein the transmitter circuit is configured to generate the output signal according to the recovery data.

3. The testing system of claim 2, further comprising:
    a processor circuit coupled to the oscilloscope circuit, wherein the processor circuit is configured to generate a calculation frequency according to the output signal received by the oscilloscope circuit, wherein the calculation frequency and the single clock pattern frequency are configured for determining the performance of the clock data recovery circuit.

4. The testing system of claim 2, wherein the device-under-test further comprises:
    a phase-locked loop circuit coupled to the clock data recovery circuit and the transmitter circuit, wherein the phase-locked loop circuit is configured to generate a second clock signal according to a first clock signal and output the second clock signal to the clock data recovery circuit and the transmitter circuit.

5. The testing system of claim 4, further comprising:
    a clock generator circuit coupled to the phase-locked loop circuit, wherein the clock generator circuit is configured to output the first clock signal to the phase-locked loop circuit.

6. The testing system of claim 5, wherein the clock generator circuit is further configured to perform a clock synchronization process on the signal generator circuit.

7. The testing system of claim 5, further comprising:
    an adder coupled to the signal generator circuit and the jitter modulation circuit, wherein the adder is configured to combine the clock pattern signal and the jitter signal to generate the input signal.

8. The testing system of claim 7, wherein the signal generator circuit, the jitter modulation circuit, the adder, and the clock generator circuit are disposed in an apparatus.

9. The testing system of claim 1, wherein the performance is a jitter tolerance.

10. The testing system of claim 1, wherein the device-under-test is a re-timer or a synchronous network.

11. A testing method, comprising:
- generating, by a signal generator circuit, a clock pattern signal with a single clock pattern frequency;
- generating, by a jitter modulation circuit, a jitter signal;
- receiving, by a device-under-test, an input signal, wherein the input signal is a combination signal of the clock pattern signal and the jitter signal, wherein the device-under-test comprises a clock data recovery circuit;
- generating, by the device-under-test, an output signal according to the input signal; and
- receiving, by an oscilloscope circuit, the output signal for determining performance of the clock data recovery circuit.

12. The testing method of claim 11, further comprising:
- generating, by a receiver front-end circuit in the device-under-test, a front-end processing signal according to the input signal;
- generating, by the clock data recovery circuit in the device-under-test, recovery data according to the front-end processing signal; and
- generating, by a transmitter circuit in the device-under-test, the output signal according to the recovery data.

13. The testing method of claim 12, further comprising:
- generating, by a processor circuit, a calculation frequency according to the output signal received by the oscilloscope circuit, wherein the calculation frequency and the single clock pattern frequency are configured for determining the performance of the clock data recovery circuit.

14. The testing method of claim 12, further comprising:
- generating, by a phase-locked loop circuit in the device-under-test, a second clock signal according to a first clock signal; and
- outputting, by the phase-locked loop circuit, the second clock signal to the clock data recovery circuit and the transmitter circuit.

15. The testing method of claim 14, further comprising:
- outputting, by a clock generator circuit, the first clock signal to the phase-locked loop circuit.

16. The testing method of claim 15, further comprising:
- performing, by the clock generator circuit, a clock synchronization process on the signal generator circuit.

17. The testing method of claim 15, further comprising:
- combining, by an adder, the clock pattern signal and the jitter signal to generate the input signal.

18. The testing method of claim 17, wherein the signal generator circuit, the jitter modulation circuit, the adder, and the clock generator circuit are disposed in an apparatus.

19. The testing method of claim 11, wherein the performance is a jitter tolerance.

20. The testing method of claim 11, wherein the device-under-test is a re-timer or a synchronous network.

* * * * *